United States Patent
Takami et al.

(10) Patent No.: US 8,901,696 B2
(45) Date of Patent: Dec. 2, 2014

(54) SOLID-STATE IMAGING DEVICE AND ELECTRONIC APPARATUS

(75) Inventors: Masashi Takami, Kumamoto (JP);
Ryoma Yoshinaga, Kagoshima (JP);
Akira Furukawa, Kagoshima (JP)

(73) Assignee: Sony Corporation, Tokyo (JP)

( * ) Notice: Subject to any disclaimer, the term of this patent is extended or adjusted under 35 U.S.C. 154(b) by 224 days.

(21) Appl. No.: 13/137,365

(22) Filed: Aug. 9, 2011

(65) Prior Publication Data

US 2012/0049305 A1    Mar. 1, 2012

(30) Foreign Application Priority Data

Aug. 30, 2010 (JP) .................................. 2010-192057

(51) Int. Cl.
*H01L 31/18* (2006.01)
*H01L 27/146* (2006.01)

(52) U.S. Cl.
CPC .... *H01L 27/14629* (2013.01); *H01L 27/14685* (2013.01); *H01L 27/14623* (2013.01); *H01L 27/14632* (2013.01); *H01L 27/14687* (2013.01); *H01L 27/14636* (2013.01)
USPC ..... 257/435; 257/436; 257/448; 257/E31.001

(58) Field of Classification Search
USPC ........... 257/435, 436, 448, 443, 459, E31.001
See application file for complete search history.

(56) References Cited

U.S. PATENT DOCUMENTS

| | | | |
|---|---|---|---|
| 2009/0065815 A1 | 3/2009 | Naya | |
| 2009/0108389 A1* | 4/2009 | Inoue | 257/435 |
| 2010/0225776 A1* | 9/2010 | Taura | 348/222.1 |

FOREIGN PATENT DOCUMENTS

JP        2009-070912        4/2009

* cited by examiner

*Primary Examiner* — Michael Shingleton
(74) *Attorney, Agent, or Firm* — Rader, Fishman & Grauer PLLC

(57) ABSTRACT

A solid-state imaging device includes: photoelectric conversion units disposed in the form of matrix in an imaging region and a peripheral region around the imaging region; transfer electrodes provided on a side of the photoelectric conversion units arranged in the vertical direction of the matrix; and first-layer wirings and second-layer wirings in a multi-layer wiring structure disposed to connect the transfer electrodes in the horizontal direction of the matrix, wherein the first-layer wirings and the second-layer wirings are provided as light-shielding patterns for covering the photoelectric conversion units in the peripheral region.

19 Claims, 7 Drawing Sheets

A-A'

A-A'

A-A'

A-A'

A-A'

SOLID-STATE IMAGING DEVICE AND ELECTRONIC APPARATUS

FIELD

The preset disclosure relates to a solid-state imaging device and electronic apparatus. More particularly, the present disclosure relates to a solid-state imaging device having black reference pixels provided at the periphery of a sensor area in which photoelectric conversion units are arranged, the black reference pixels being provided by shielding the photoelectric conversion units from light. The present disclosure also relates to an electronic apparatus having such a solid-state imaging device.

BACKGROUND

In a solid-state imaging device having photoelectric conversion units arranged in the form of a matrix in an imaging region, an optical black region (hereinafter referred to as "OB region") is provided at the periphery of the imaging region. The OB region is formed by light-shielded photoelectric conversion units disposed in the peripheral region. The OB region is shielded from light using a light-shielding film for covering transfer electrodes disposed beside the photoelectric conversion units and transfer wirings connected to the electrodes. The light-shielding film has pixel openings at which only the tops of the photoelectric conversion units in the imaging region are exposed.

The OB region must be reliably shielded from light to set a proper reference for black levels output from pixels. However, it is known that sufficient light-shielding performance is not provided by a light-shielding film as described above alone.

Under the circumstance, light-shielding performance sufficient for the OB region is achieved by shielding the OB region further by using wirings for peripherals circuits laid outside the OB region.

Another proposed solution is to use a light-shielding film made of a conductive material and having a structure formed by two layers electrically isolated from each other by an insulation layer interposed between them. The film serves as a double shield covering only an OB region to minimize smear on a reference signal for an optical black level attributable to electric charges (see JP-A-2009-70912 (in particular, paragraph 0037) (Patent Document 1))

SUMMARY

Although an OB region can be kept shielded from light by the configuration for shielding the OB region from light using wirings for peripheral circuits or the configuration including a light-shielding film having a double layer structure for shielding the OB region as described above, an OB region in such a configuration has a greater number of layers provided thereon compared to an imaging region. As a result, a planarizing insulation film covering the imaging region and the OB region will have a step at the boundary between those regions. Such a step at a boundary can result in a problem in imaging characteristics, i.e., a problem called picture frame irregularities.

It is therefore desirable to provide a solid-state imaging device in which an imaging region and an OB region can be kept level with each other at a boundary between them while shielding the Ob region from light sufficiently. Thus, a highly accurate reference signal for an optical black level can be obtained without degrading imaging characteristics.

An embodiment of the present disclosure is directed to a solid-state imaging device including photoelectric conversion units provided in the form of a matrix in an imaging region and a peripheral region around the imaging region. Transfer electrodes are provided on a side of the photoelectric conversion units and arranged in the vertical direction of the matrix. First-layer wirings and second-layer wirings are provided in a multi-layer wiring structure so as to connect the transfer electrodes in the horizontal direction of the matrix. In the peripheral region around the imaging region, the first-layer wirings and the second-layer wirings are provided as light-shielding patterns to cover the photoelectric conversion units. Another embodiment of the present disclosure is directed to an electronic apparatus including a solid-state imaging device having the above-described configuration.

In a configuration as thus described, photoelectric conversion units in the peripheral region are sufficiently shielded from light by the light-shielding patterns having a multi-layer structure formed by the first-layer wirings and the second-layer wirings. Since the first-layer wirings and the second-layer wirings forming the light-shielding patterns connect the transfer electrodes in the horizontal direction, those wirings are also laid in the imaging region. Therefore, layers formed in the peripheral region and the imaging region are identical in structure, which allows the boundary between the regions kept planar.

As described above, according to the embodiments of the present disclosure, the boundary between the imaging region and the peripheral region can be kept planar while shielding the photoelectric conversion units from light sufficiently in the peripheral region around the imaging region. Thus, a highly accurate reference signal for an optical black level can be obtained in the peripheral region where the photoelectric conversion units are sufficiently shielded from light while maintaining high imaging characteristics throughout the imaging region.

DETAILED DESCRIPTION

Embodiments of the present disclosure will now be described with reference to the drawings according to the following list.

1. Schematic Exemplary Configuration of Solid-State Imaging Device
2. Embodiment of Solid-State Imaging Device
3. Embodiment of Electronic Apparatus

1. Schematic Exemplary Configuration of Solid-State Imaging Device

Figure 1:
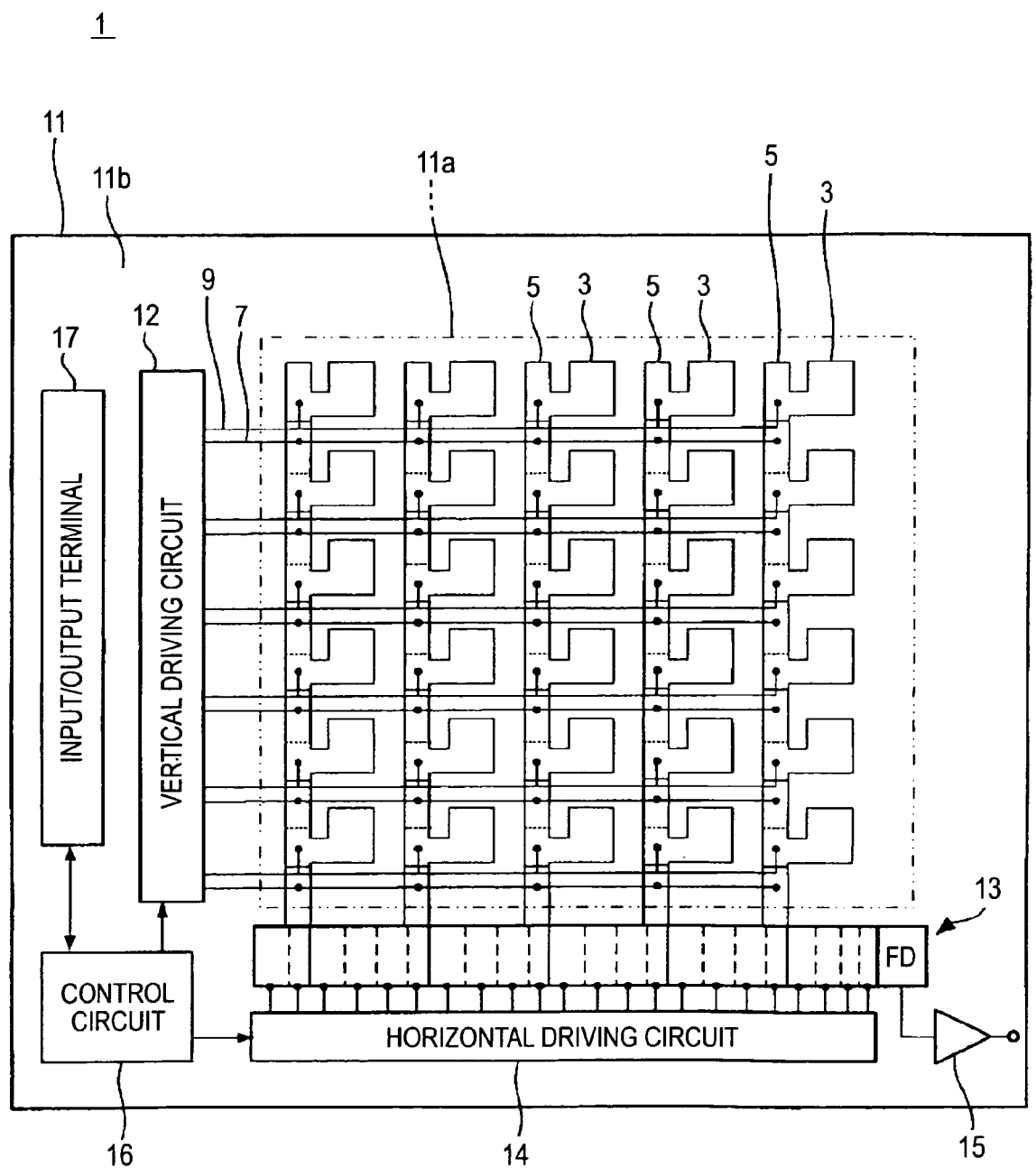
FIG. 1 is a schematic configuration diagram of a CCD type solid-state imaging device embodying the present disclosure.

FIG. 1 shows a schematic exemplary configuration of a CCD-type solid-state imaging device 1 embodying the present disclosure.

The solid-state imaging device 1 shown in the figure has a sensor area 11a including photoelectric conversion units 3 arranged in the form of a matrix on one surface of a semiconductor substrate 11 made of, for example, polycrystalline silicon and a driving area 11b disposed around the sensor area 11a.

In addition to the photoelectric conversion units 3 which are, for example, photodiodes, vertical charge transfer sections 5 extending in the vertical direction of the figure on a side of respective photoelectric conversion units 3 and first-layer wirings 7 and second-layer wirings 9 for driving the vertical charge transfer sections 5 are provided in the sensor area 11a. As will be detailed below, each vertical charge transfer section 5 is formed by a vertical transfer path constituted by an impurity region and a vertical transfer electrode provided above the path. The section reads a signal charge from a photoelectric conversion unit 3 adjacent thereto and transfers the read signal charge in the vertical direction of the figure. The first-layer wirings 7 and the second-layer wirings 9 are provided so as to establish horizontal connection between respective vertical transfer electrodes forming part of the vertical charge transfer sections 5.

Micro lenses such as an in-layer lens and an on-chip lens, described later, are disposed above each photoelectric conversion unit 3 to achieve high convergence of light on the photoelectric conversion unit. Optical filters such as a transparent white filter and color filters of various colors are disposed between the in-layer lens and the on-chip lens such that light beams having particular wavelengths are selectively made to impinge on the unit.

The driving area 11b includes a vertical driving circuit 12, a horizontal charge transfer section 13, a horizontal driving circuit 14, an output circuit 15, a control circuit 16, and an input/output terminal 17.

For example, the vertical driving circuit 12 is formed by shift registers, and the circuit selects first-layer wirings 7 and second layer wirings 9, supplies pulses to the selected first-layer wirings 7 and second-layer wirings 9 to drive the respective vertical charge transfer sections 5. Thus, the vertical charge transfer sections 5 are driven one row after another. Specifically, the vertical driving circuit 12 reads signal charges from the photoelectric conversion units 3 of the sensor area 11a one row after another and supplies them to the vertical charge transfer sections 5, and the read signal charges are sequentially transferred in the vertical direction of the figure.

The horizontal charge transfer section 13 is formed by a horizontal transfer path which is constituted by an impurity region like the vertical charge transfer sections 5 and a horizontal transfer electrode which is provided on the path. The electrode extends in the horizontal direction of the figure to serve as final stages of the vertical charge transfer sections 5. The horizontal charge transfer section 13 transfers signal charges from the vertical charge transfer sections 5 in the horizontal direction of the figure.

For example, the horizontal driving circuit 14 is formed by shift registers, and the circuit sequentially outputs horizontal scan pulses to drive the horizontal charge transfer section 13. Specifically, the horizontal driving circuit 14 reads signal charges transferred from the vertical charge transfer sections 5 of each column and supplies them to the horizontal charge transfer section 13, and the read signal charges are sequentially transferred in the vertical direction of the figure.

The output circuit 15 performs signal processing on the signal charges sequentially transferred by the horizontal charge transfer section 13 and outputs the resultant signal charges. For example, only buffering may be performed by the circuit, and the circuit may alternatively perform other processes such as black level adjustment, correction of variation between columns, and various types of digital signal processing.

The control circuit 16 receives an input clock and data for instructing operation modes and the like, and the circuit outputs data such as internal information of the solid-state imaging device 1. Specifically, the control circuit 16 generates clock signals and control signals to serve as references for the operations of the vertical driving circuit 12 and the horizontal driving circuit 14 based on a vertical synchronization signal, a horizontal synchronization signal, and a master clock. Those signals are input to the vertical driving circuit 12 and the horizontal driving circuit 14.

The input/output terminal 17 is connected to the output circuit 15 and the control circuit 16 to allow signals to be transmitted and received to and from the outside of the device.

The sensor area 11a of the solid-state imaging device 1 having the above-described configuration has subdivisions, i.e., an imaging region and a peripheral region. The imaging region is a region located in the middle of the sensor area 11a and occupying a major part of the area, and the region is configured to allow the photoelectric conversion units 3 to receive light. The peripheral region is disposed around the periphery of the imaging region, and the region is configured to shield the photoelectric conversion units 3 therein from light to disable reception of light at such units. Such a light-shielding structure is one of characteristics of the present disclosure as will be apparent from the following detailed description of an embodiment of the present disclosure.

2. Embodiment of Solid-State Imaging Device

Figure 2:
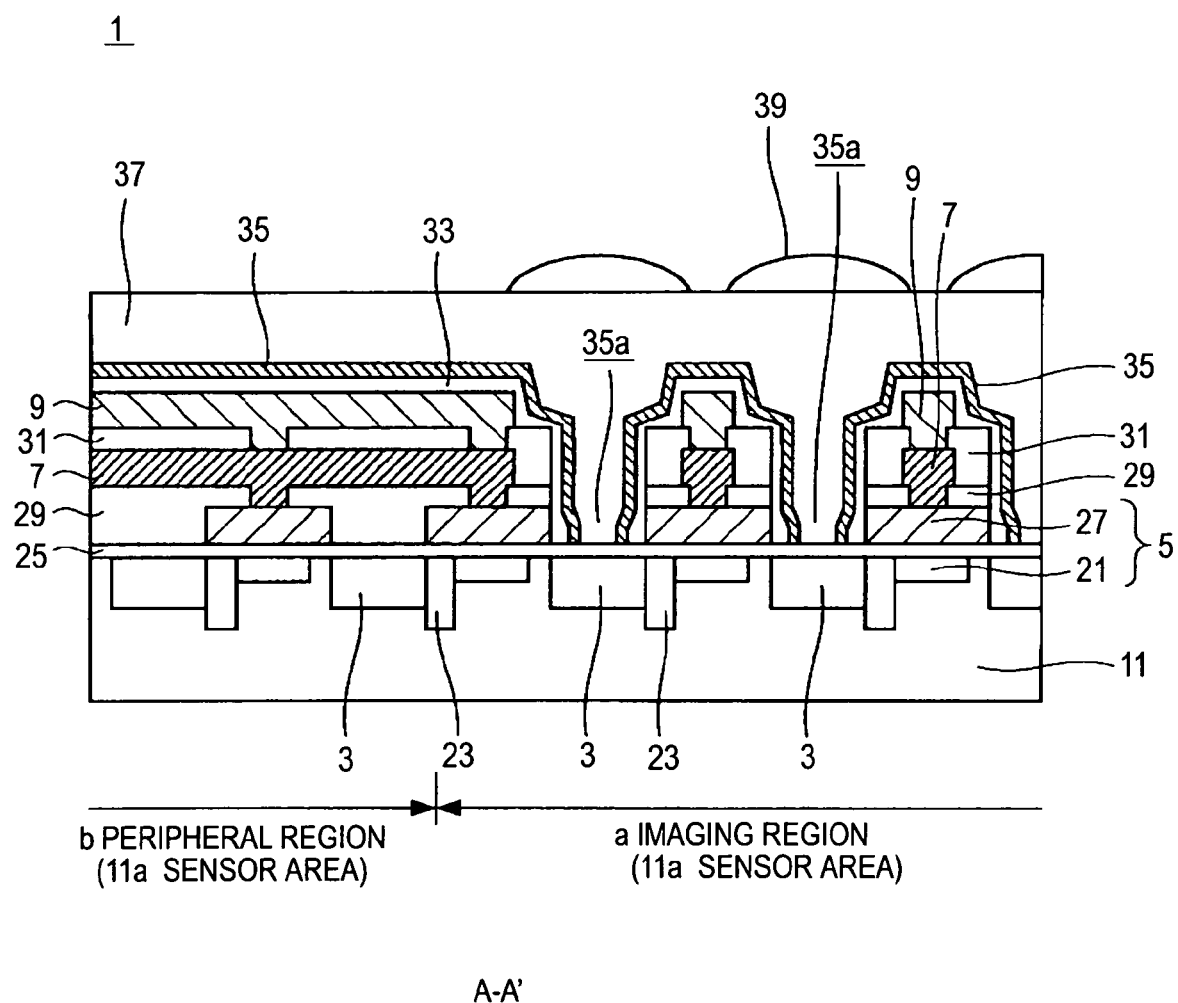
FIG. 2 is a sectional view of major parts of the solid-state imaging device according to the embodiment showing a configuration of the device.

FIG. 2 is a sectional view of major parts of a solid-state imaging device embodying the present disclosure, the figure showing a configuration of the device. The figure shows the neighborhood of a boundary between an imaging region a and a peripheral region b of a sensor area 11a. FIGS. 3 to 6 are plan views of layers of the solid-state imaging device of the embodiment shown in FIG. 2 for explaining a configuration of the solid-state imaging device, the figures showing respective layers starting with the layer at the bottom shown in FIG. 3. Each plan view is accompanied by a sectional view taken along line A-A' therein.

Details of the solid-state imaging device shown in FIG. 2 will now be described with reference to FIGS. 3 to 6 starting with the layer at the bottom. A common reference numeral will be used to indicate a constituent element of the device shown in FIGS. 3 to 6 and a constituent element described with reference to FIG. 1 when the elements are identical to each other. Insulation films are shown only in the sectional views and are omitted in the plan views.

Figure 3:
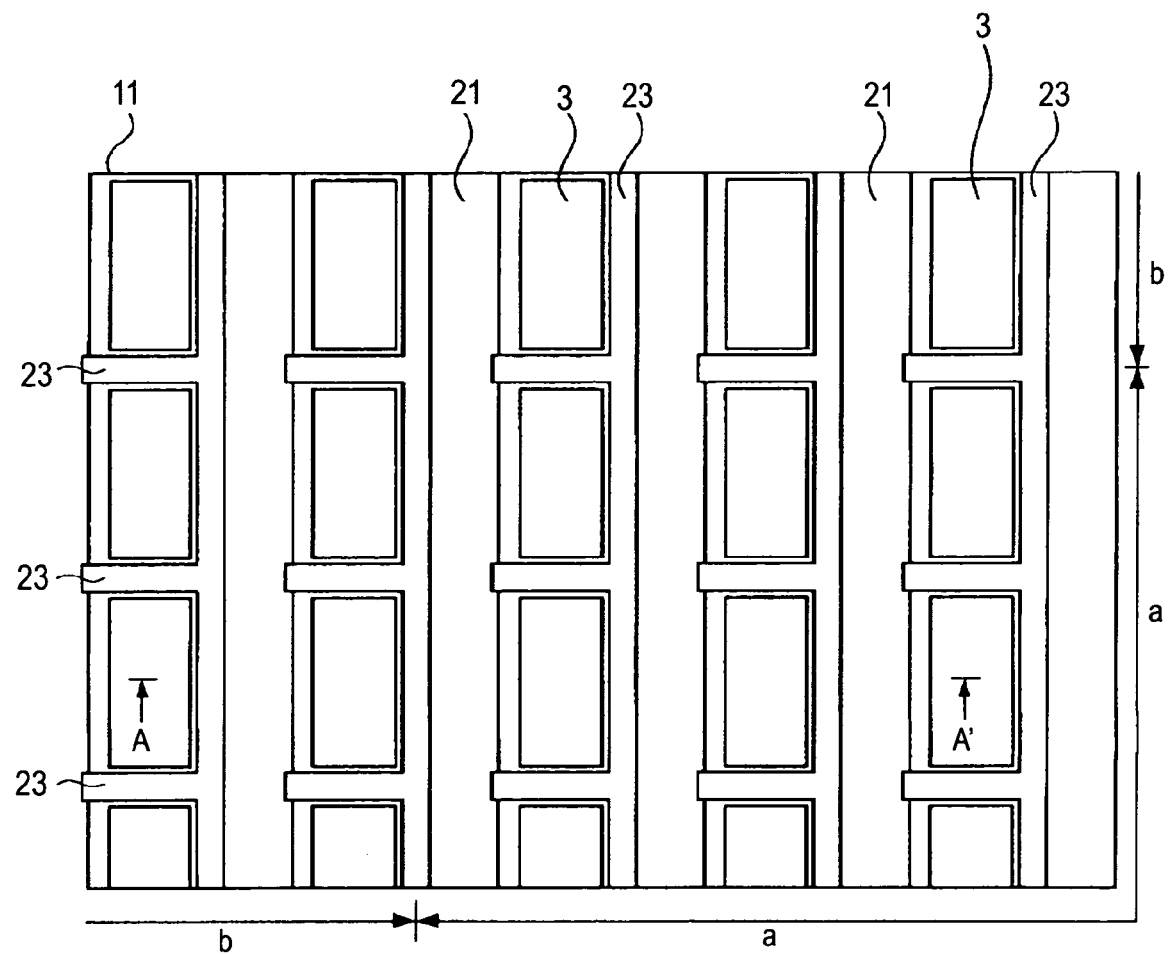
FIG. 3 is illustrations of major parts of the solid-state imaging device of the embodiment taken at a manufacturing step for explaining a configuration of the device.
Figure 3:
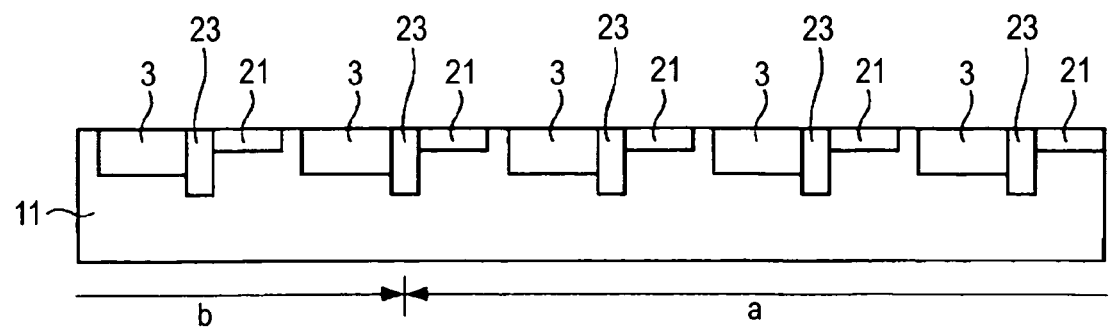

As shown in FIG. 3, photoelectric conversion units 3 are arranged in the form of a matrix throughout a top surface of a sensor area 11a of a semiconductor substrate 11 which is, for example, a p-type semiconductor. The photoelectric conversion units 3 are n-type impurity layers. A vertical transfer path 21 is provided on one side of each photoelectric conversion unit 3 such that it extends in the vertical direction of the figure at a certain distance from the unit. The vertical transfer paths 21 are n-type impurity layers. The gap between a photoelectric conversion unit 3 and a vertical transfer path 21 serves as a channel region for reading out an electric charge at the photoelectric conversion unit 3 and supplying it to the vertical transfer path 21.

Element isolating regions 23 are provided in positions on the side of the photoelectric conversion units 3 opposite to the side of the units where the vertical transfer paths 21 are provided and in positions sandwiching the photoelectric conversion units 3 in the vertical direction of the plan view such that the photoelectric conversion units 3 are surrounded by the element isolating regions in three directions. The element isolating regions 23 are p-type impurity layers which are disposed in contact with the photoelectric conversion units 3 and the vertical transfer paths 21.

For example, the photoelectric conversion units 3, the vertical transfer paths 21, and the element isolating regions 23 are formed by performing ion implantation and a thermal process subsequently.

Figure 4:
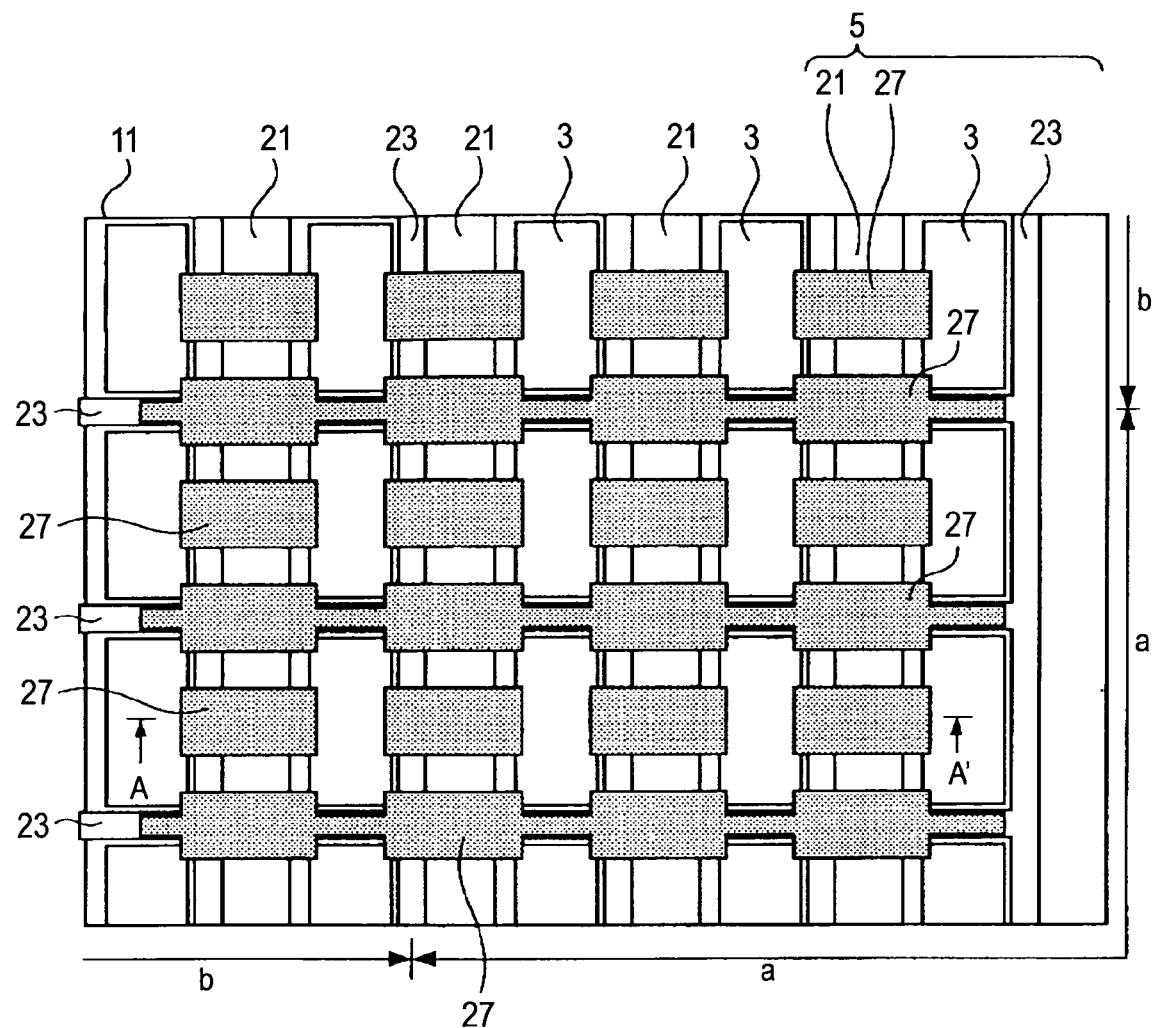
FIG. 4 is illustrations of major parts of the solid-state imaging device of the embodiment taken at a manufacturing step for explaining the configuration of the device.
Figure 4:
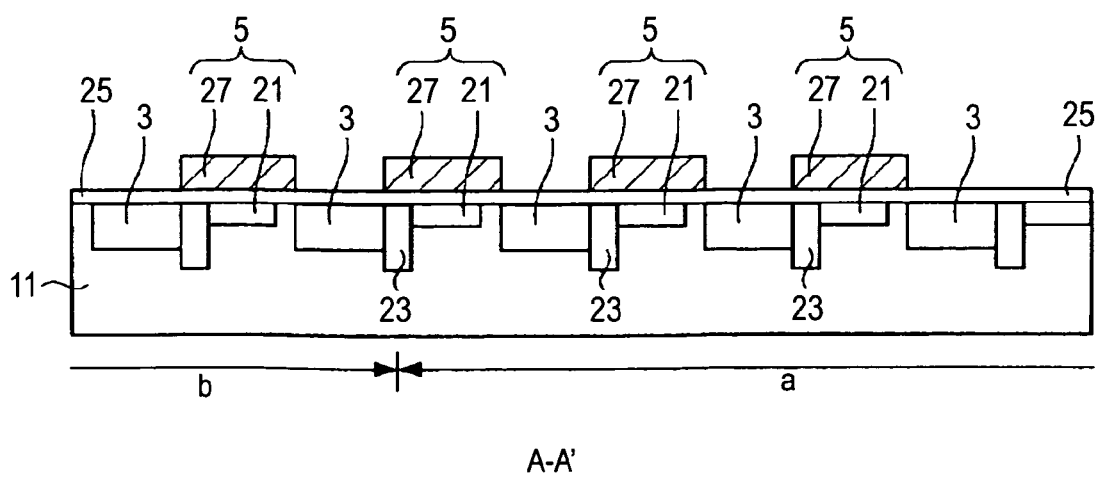

As shown in FIG. 4, the vertical transfer electrodes 27 are provided on the semiconductor substrate 11 having the photoelectric conversion units 3, the vertical transfer paths 21, and the element isolating regions 23 provided on the top surface thereof, a gate insulation film 25 being interposed between the electrodes 27 and the features on the substrate. The vertical transfer electrodes 27 form the vertical charge transfer sections 5 in cooperation with the vertical transfer paths 21, and the electrodes are arranged on the vertical transfer paths 21 extending in the vertical direction of the plan view. The vertical transfer electrodes 27 are insulated from each other in the vertical direction of the plan view, and the electrodes are patterned to have a width greater than the width of the vertical transfer paths 21. The vertical transfer electrodes 27 may be formed such that they appear as continuous patterns when viewed in the horizontal direction of the plan view by connecting the electrodes to each other in positions above the element isolating regions 23 as illustrated. It is not essential to connect the electrodes in the horizontal direction of the plan view. The vertical transfer electrodes 27 as thus described are made of, for example, polysilicon, and the electrodes are formed by patterning a polysilicon film.

The above-described patterns of the constituent elements provided in a layer configuration similarly repeat throughout the sensor area 11a. There is no difference between the imaging region a and the peripheral region b in terms of the patterns of those elements, and a characteristic resides in the patterns of subsequent layers.

Figure 5:
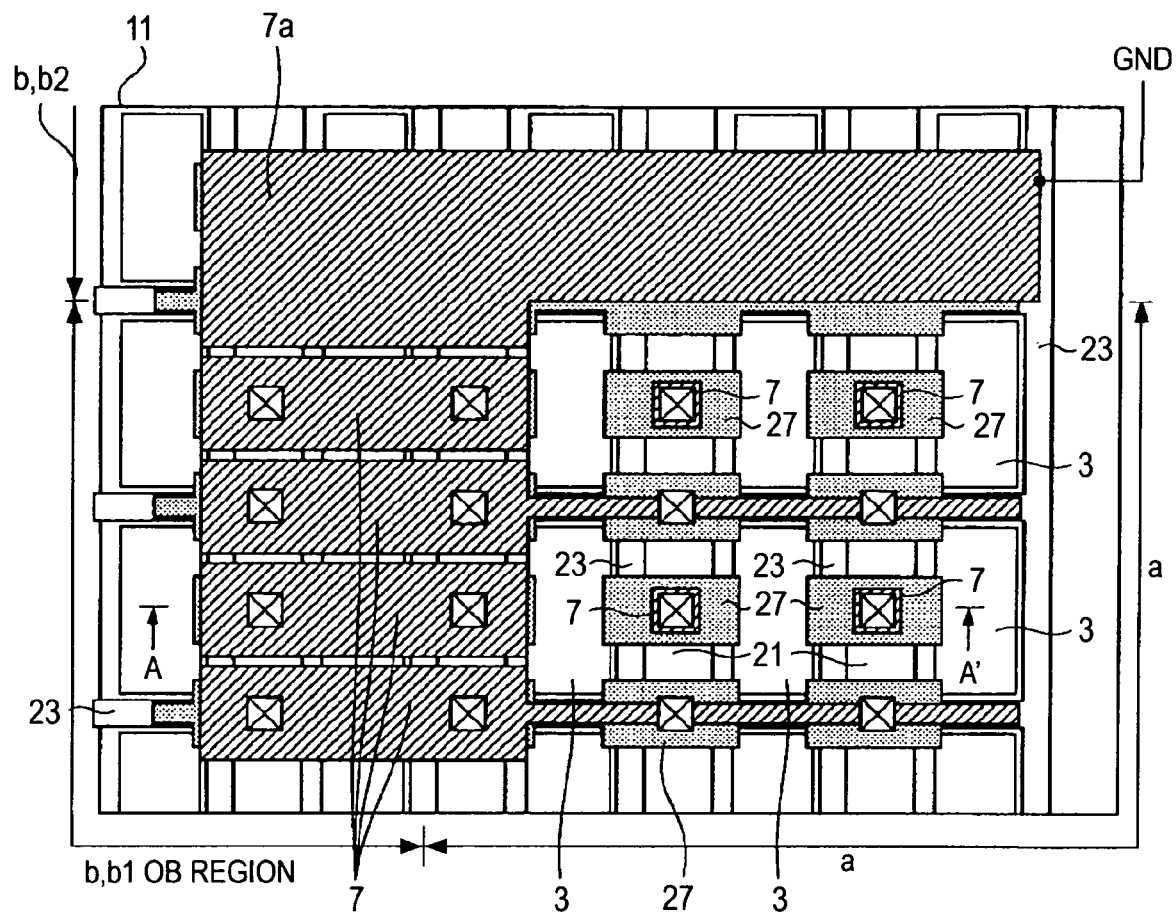
FIG. 5 is illustrations of major parts of the solid-state imaging device of the embodiment taken at a manufacturing step for explaining the configuration of the device.
Figure 5:
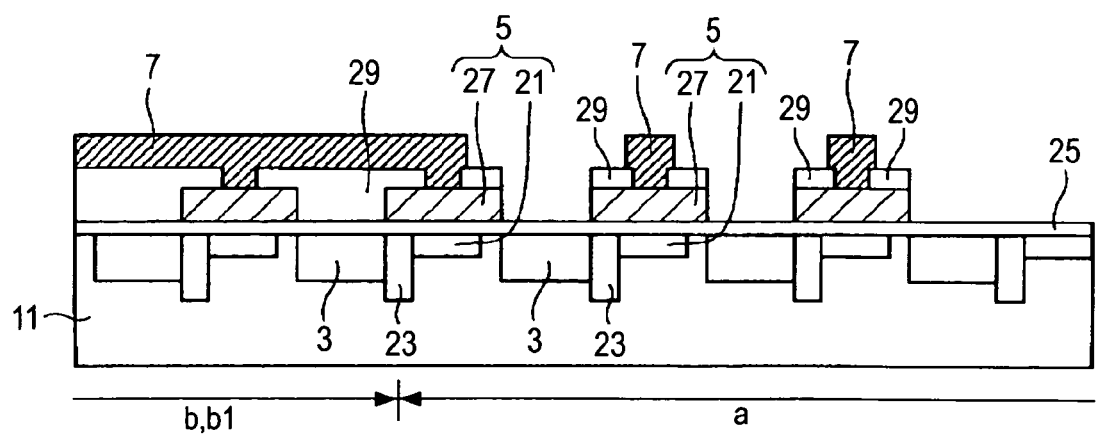

As shown in FIG. 5, first-layer wirings 7 and a first light-shielding mask 7a residing in the same layer as the first-layer wirings 7 are provided on the semiconductor substrate 11 having the vertical transfer electrodes 27 thereon with a layer insulation film 29 interposed.

The first-layer wirings 7 are provided for driving the vertical transfer electrodes 27 in combination with second-layer wirings which will be described later. In one mode of disposition of the first-layer wirings 7, the wirings are laid to extend in the horizontal direction of the plan view (row direction) above the element isolating regions 23 provided between the vertically extending arrays of the photoelectric conversion units 3. For example, the first-layer wirings 7 are laid to connect vertical transfer electrodes 27 to each other such that horizontal arrays of electrodes, e.g., even-numbered rows of electrodes, will be formed.

In another mode of disposition of the first-layer wirings 7, for example, the wirings are provided in the form of electrode pads on vertical transfer electrodes 27 disposed in odd-numbered rows extending in the horizontal direction of the plan view to allow those electrodes to be connected to vertical transfer electrodes 27 disposed on odd-numbered rows using the second-layer wirings which will be described later. The sectional view in FIG. 5 shows a section of a region including vertical transfer electrodes 27 disposed on an odd-numbered row extending in the horizontal direction of the plan view.

In each mode of disposition of the first-layer wirings 7, the wirings are connected to the respective vertical transfer electrodes 27 through connection holes provided in the layer insulation film 29.

The present embodiment is characterized in that the first-layer wirings 7 laid as described above are in the form of openings for exposing the photoelectric conversion units 3 in the imaging region a and are in the form of light-shielding patterns for shielding the photoelectric conversion units 3 from light in the peripheral region b.

The peripheral region b provided around the imaging region a includes an OB region b1 which is a region provided adjacent to the imaging region a in the horizontal direction of the plan view in order to obtain a reference signal for an optical black level. In such an OB region b1, the first-layer wirings 7 are laid as light-shielding patterns covering the photoelectric conversion units 3. In the OB region b1, the first-layer wirings 7 are patterned separately from each other and are preferably disposed at small intervals to keep the photoelectric conversion units 3 sufficiently shielded from light.

The peripheral region 6 provided around the imaging region a includes a light-shielding region b2 which is a region provided adjacent to the imaging region a and the OB region b1 in the vertical direction of the plan view in order to keep the sectional structure of the imaging region a uniform up to the periphery of the region. Photoelectric conversion units 3 disposed in the light-shielding region b2 thus described are provided as dummies, and it is therefore unnecessary to read electrical charges from those units. Therefore, the first light-shielding mask 7a forming the same layer as the first-layer wirings 7 is disposed in the light-shielding region b2 without connecting it to vertical transfer electrodes 27 provided in the region. Since the first light-shielding mask 7a is therefore in a floating state, the mask is connected to the ground. The first light-shielding mask 7a may be connected to the vertical transfer electrodes 27 when it is connected to the ground.

The above-described first-layer wirings 7 and first light-shielding mask 7a are made of conductive materials having high light-shielding performance and conductivity, e.g., metal materials. For example, the wirings and the mask may be formed by patterning a multi-layer film made of titanium nitride (TiN), titanium (Ti), and tungsten (W).

Figure 6:
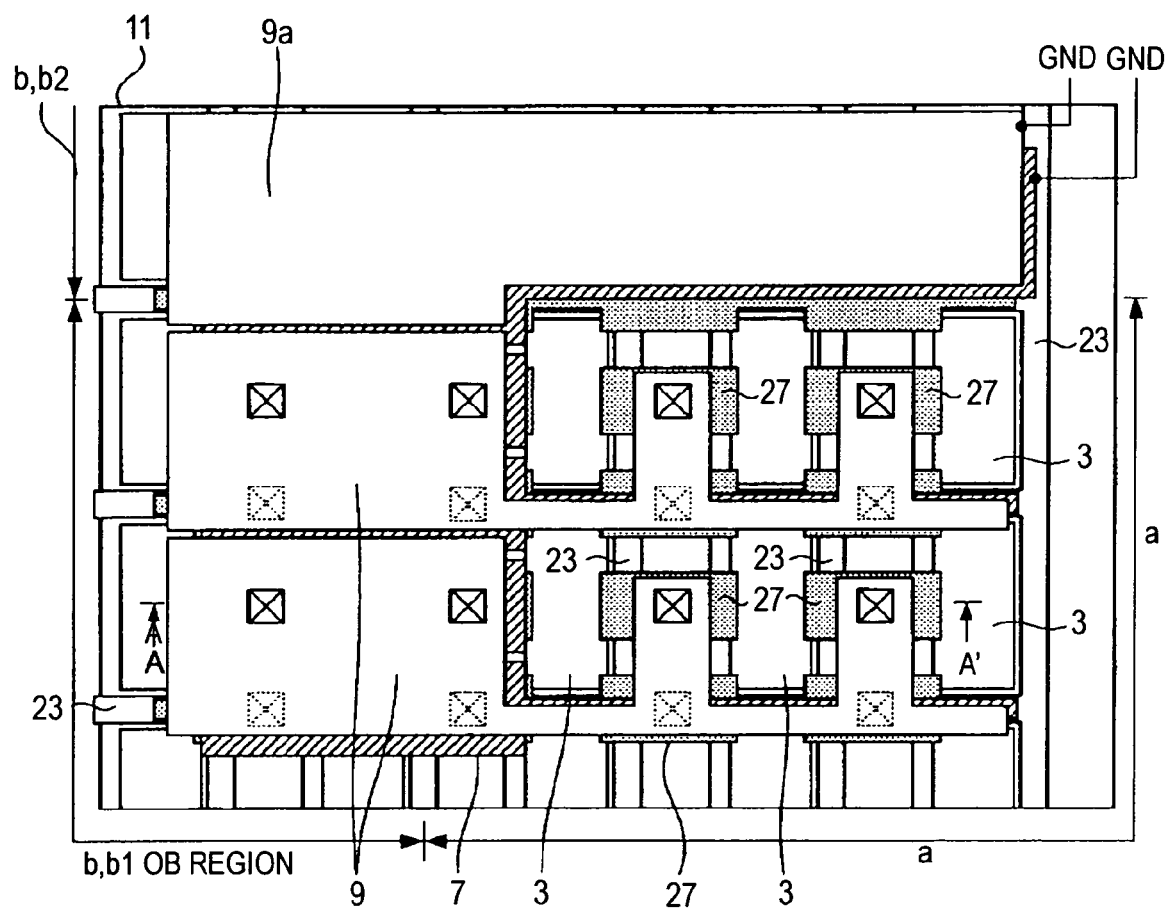
FIG. 6 is illustrations of major parts of the solid-state imaging device of the embodiment taken at a manufacturing step for explaining the configuration of the device.
Figure 6:
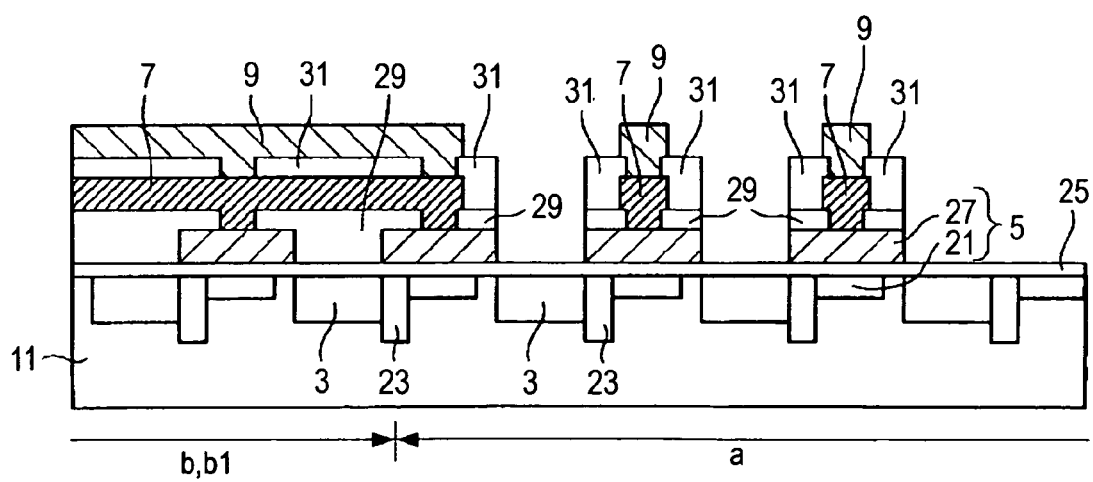

As shown in FIG. 6, second-layer wirings 9 and a second light-shielding mask 9a forming the same layer as the second-layer wiring 9 are provided on the semiconductor substrate 11 having the first-layer wirings 7 and the first light-shielding mask 7a provided thereon with a layer insulation film 31 interposed.

The second-layer wirings 9 are provided for driving the vertical transfer electrodes 27 in cooperation with the first-layer wirings 7. Referring to the disposition of the second-layer wirings 9, the wirings are laid above the first-layer wirings 7 provided on the element isolation regions 23 between vertical arrays of the photoelectric conversion units 3. Each of the wirings partially extends in the vertical direction of the plan view (column direction) at intervals between photoelectric conversion units 3 to reach the vertical transfer electrodes 27 disposed on an odd-numbered row associated with the wiring. Thus, the wirings are laid to connect vertical transfer electrodes 27 in horizontal rows, e.g., odd-numbered rows to each other.

The above-described second-layer wirings 9 are connected to the first-layer wirings 7 disposed on the odd-numbered rows through connection holes provided in the layer insulation film 31, and the wirings 9 are further connected to the vertical transfer electrodes 27 disposed on the odd-numbered rows through the first-layer wirings 7.

The present embodiment is characterized in that the second-layer wirings 9 laid as described above are in the form of openings for exposing the photoelectric conversion units 3 in the imaging region a and are in the form of light-shielding patterns for shielding the photoelectric conversion units 3 from light in the OB region b1 of the peripheral region b. In the OB region b1, the second-layer wirings 9 are provided such that they cover the gaps between the patterns of the first-layer wirings 7 and overlap the first-layer wirings 7 sufficiently, whereby the OB region b1 is sufficiently shielded from light. In order to prevent the generation of parasitic capacities at overlaps between the first-layer wirings 7 and the second-layer wirings 9, the second-layer wirings 9 may be patterned such that the wirings cover only the gaps between the patterns of the first-layer wirings 7 and such that the OB region b1 will be shielded from light by the second-layer wirings 9 only in parts of the region which are not shielded by the first-layer wirings 7.

In the light-shielding region b2 of the peripheral region b disposed adjacent to the imaging region a in the vertical direction of the plan view, the second light-shielding mask 9a forming the same layer as the second-layer wirings 9 is provided without connecting it to the first light-shielding mask 7a and the vertical transfer electrodes 27. Since the second light-shielding mask 9a is therefore in a floating state, the mask is connected to the ground. The second light-shielding mask 9a may be connected to the first light-shielding mask 7a and the vertical transfer electrodes 27 when it is connected to the ground. Only either of the first light-shielding mask 7a or the second light-shielding mask 9a may be provided in the peripheral region b in order to prevent parasitic capacities that are generated by overlapping of the first light-shielding mask 7a and the second light-shielding mask 9a.

The above-described second-layer wirings 9 and second light-shielding mask 9a are made of conductive materials having high light-shielding performance and conductivity, e.g., metal materials. For example, the wirings and the mask may be formed by patterning a multi-layer film made of titanium nitride (TiN), titanium (Ti), and tungsten (W).

As shown in FIG. 2, a light-shielding film 35 is provided on the semiconductor substrate 11 having the second-layer wirings 9 and the second light-shielding mask 9a provided thereon with a layer insulation film 33 interposed. The light-shielding film 35 has a plurality of sensor openings 35a provided above the photoelectric conversion units 3 arranged on the imaging region a to expose the individual units. The light-shielding film 35 is formed using a material having high light-shielding performance such as tungsten (W).

A planarizing insulation film 37 is provided on the light-shielding film 35, and micro lenses 39 for converging light on the photoelectric conversion units 3 arranged on the imaging region a are disposed on the planarizing insulation film 37. Thus, a solid-state imaging device 1 is completed.

In the solid-state imaging device 1 having the above-described configuration, the photoelectric conversion units 3 disposed in the peripheral region b, and more particularly, the units 3 in the OB region b1 are sufficiently shielded from light by light-shielding patterns having a multi-layer structure formed by the first-layer wirings 7 and the second-layer wirings 9 which are also disposed in the imaging region a. Therefore, a signal charge read from the photoelectric conversion units 3 in the OB region b1 can be used as a highly accurate reference signal for an optical black level.

The photoelectric conversion units 3 disposed in the light-shielding region b2 of the peripheral region b are also shielded from light by a multi-layer structure formed by the first light-shielding mask 7a and the second light-shielding mask 9a forming the same layers as the first-layer wirings 7 and the second-layer wirings 9, respectively. That is, the peripheral region b can be shielded from light by the same layered structure as provided in the imaging region a without adding any special light-shielding film in the region b.

As thus described, the structure of the layers provided on the substrate 11 is identical between the peripheral region b including the OB region b1 and the light-shielding region b2 and the unshielded imaging region a having the photoelectric conversion units 3 disposed therein. As a result, no step is formed on the surface of the planarizing insulation film 37 covering the imaging region a and the peripheral region b in the position of the film corresponding to the boundary between the imaging region a and the peripheral region b.

Thus, high imaging characteristics can be achieved throughout the imaging region a including the boundary between the region a and the peripheral region b. Specifically, it is possible to prevent problems such as degradation of converging performance of the micro lenses which can occur if the micro lenses are disposed on a step formed at the planarizing insulation film 37 in the neighborhood of the boundary between the imaging region a and the peripheral region b. Thus, high imaging characteristics can be maintained throughout a greater part of the imaging region a.

Since high imaging characteristics can be maintained throughout the imaging region a as described above, when a dummy region is set at the boundary between the imaging region a and the peripheral region b, the area of the imaging region a occupied by the gummy region can be set small to provide a wider effective pixel region. A dummy region is a region where photoelectric conversion units 3 making no direct contribution to display of an image are disposed.

In the solid-state imaging device 1 described above as one embodiment of the present disclosure, a highly accurate reference signal for an optical black level can be obtained in the peripheral region b (OB region b1) where the photoelectric conversion units 3 are sufficiently shielded from light while maintaining imaging characteristics sufficiently high throughout the imaging region a.

3. Embodiment of Electronic Apparatus

A solid-state imaging device according to the above-described embodiment of the present disclosure may be used in electronic apparatus, e.g., camera systems such as digital cameras and video cameras, mobile phones having an imaging function, and other apparatus having an imaging function.

Figure 7:
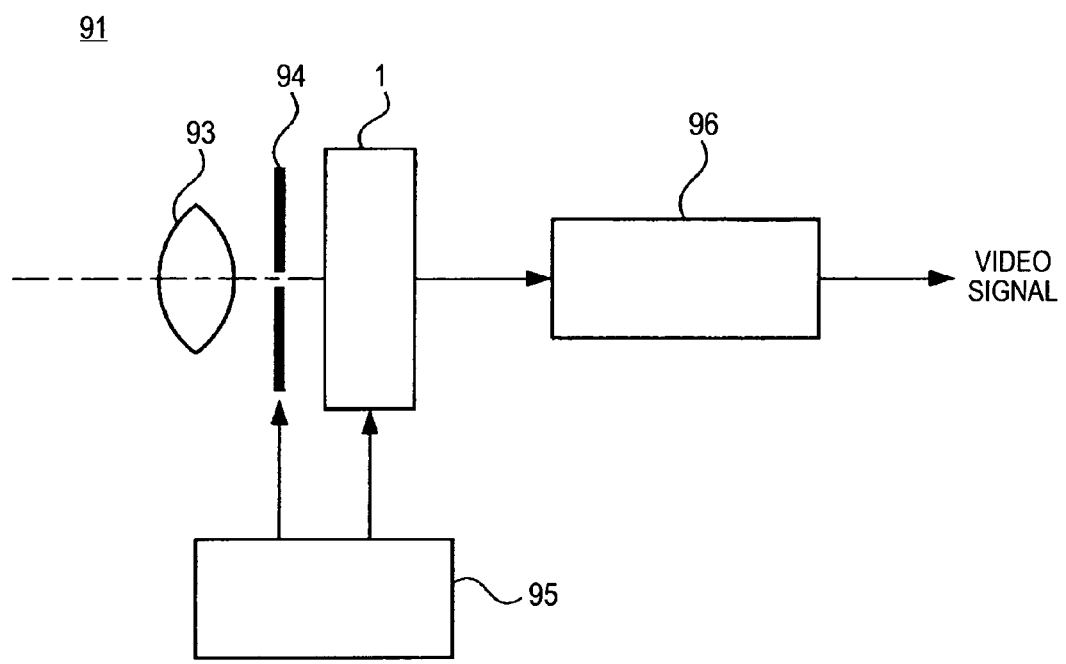
FIG. 7 is a configuration diagram of an electronic apparatus according to another embodiment of the present disclosure.

FIG. 7 is a configuration diagram of a camera employing the solid-state imaging device as an example of an electronic apparatus according to the present disclosure. A camera 91 of the present embodiment is an example of a video camera capable of shooting still images or motion pictures. The camera 91 of the preset embodiment includes a solid-state imaging device 1, an optical system 93 for guiding incident light to a light-receiving sensor section of the solid-state imaging device 1, a shutter device 94, a driving circuit 95 for driving the solid-state imaging device 1, and a signal processing circuit 96 for processing signals output from the solid-state imaging device 1.

The solid-state imaging device 1 employs the configuration of the above-described embodiment. The optical system (optical lens) 93 forms an image of image light (incident light) from an object on an imaging plane of the solid-state imaging device 1. As a result, signal charges are accumulated in the solid-state imaging device 1 for a predetermined period of time. The optical system 93 may be an optical lens system formed by a plurality of optical lenses. The shutter device 94 controls a period for illuminating the solid-state imaging device 1 and a period for shielding the device from light. The driving circuit 95 supplies driving signals for controlling a transfer operation of the solid-state imaging device 1 and a shutter operation of the shutter device 94. A signal is transferred from the solid-state imaging device 1 according to a driving signal (timing signal) supplied from the driving circuit 95. The signal processing circuit 96 performs various types of signal processing. A video signal thus processed is stored in a storage medium such as a memory or output to a monitor.

The above-described electronic apparatus according to the present disclosure can obtain images of high quality because it employs the solid-state imaging device 1 capable of obtaining a highly accurate reference signal for an optical black level while maintaining high imaging characteristics throughout the imaging region a.

The present disclosure contains subject matter related to that disclosed in Japanese Priority Patent Application JP 2010-192057 filed in the Japan Patent Office on Aug. 30, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a substrate electrically isolated from a layer of transfer electrodes, said layer of transfer electrodes being within an insulation film;
   a peripheral first-layer wire electrically connected to an imaging electrode of the transfer electrodes and to a peripheral electrode of the transfer electrodes, said insulation film being between said substrate and a portion of the peripheral first-layer wire;
   a peripheral region photoelectric conversion unit within said substrate, a conductivity of the substrate differing from a conductivity of the peripheral region photoelectric conversion unit;
   a peripheral second-layer wire electrically connected to said peripheral first-layer wire, an electrical isolation film being between a portion of the peripheral second-layer wire and said portion of the peripheral first-layer wire;
   an optical black opening between said portion of the peripheral first-layer wire and said peripheral region photoelectric conversion unit, said optical black opening physically separating said imaging electrode from said peripheral electrode,
   wherein a portion of the insulation film is within said optical black opening.

2. The solid-state imaging device according to claim 1, wherein said conductivity of the substrate is opposite to said conductivity of the peripheral region photoelectric conversion unit.

3. The solid-state imaging device according claim 1, wherein said portion of the peripheral first-layer wire is between said optical black opening and said electrical isolation film, said electrical isolation film being between said optical black opening and said portion of the peripheral second-layer wire.

4. The solid-state imaging device according to claim 1, wherein said electrical isolation film is an insulator.

5. The solid-state imaging device according to claim 1, wherein said peripheral region photoelectric conversion unit is N-type.

6. The solid-state imaging device according to claim 1, further comprising:
   an imaging second-layer wire electrically connected to said imaging first-layer wire, said imaging second-layer wire and said peripheral second-layer wire being in a layer of second-layer wirings.

7. The solid-state imaging device according to claim 6, further comprising:
   a second light-shielding mask electrically connected to ground, said second light-shielding mask being in said layer of second-layer wirings.

8. The solid-state imaging device according to claim 1, further comprising:
   an imaging region photoelectric conversion unit within said substrate, said imaging region photoelectric conversion unit being between said peripheral region photoelectric conversion unit and a transfer path.

9. The solid-state imaging device according to claim 8, wherein said imaging region photoelectric conversion unit is configured to covert light into a signal charge.

10. The solid-state imaging device according to claim 8, wherein said transfer path is within said substrate.

11. The solid-state imaging device according to claim 8, wherein said imaging region photoelectric conversion unit and said peripheral region photoelectric conversion unit are of a same conductivity type.

12. The solid-state imaging device according to claim 8, wherein said imaging region photoelectric conversion unit and said transfer path are of a same conductivity type.

13. The solid-state imaging device according claim 8, further comprising:
   an imaging first-layer wire electrically connected to a different electrode of the transfer electrodes, said imaging first-layer wire and said peripheral first-layer wire being in a layer of first-layer wirings.

14. The solid-state imaging device according to claim 13, further comprising:
   a first light-shielding mask electrically connected to ground, said first light-shielding mask being in said layer of first-layer wirings.

15. The solid-state imaging device according to claim 13, further comprising:
   a first-layer wire opening between said imaging first-layer wire and said peripheral first-layer wire, said first-layer wire opening separating said imaging first-layer wire and said peripheral first-layer wire.

16. The solid-state imaging device according to claim 15, further comprising:
   a conversion region opening between said first-layer wire opening and said imaging region photoelectric conversion unit, said conversion region opening physically separating said imaging electrode from said different electrode of the transfer electrodes.

17. The solid-state imaging device according to claim 16, further comprising:
   a second-layer wire opening between said conversion region opening and said first-layer wire opening, said second-layer wire opening physically separating said imaging second-layer wire from said peripheral second-layer wire.

18. The solid-state imaging device according to claim 16, further comprising:
a planarizing insulation film between a micro lens and a light-shielding film, an opening through said light-shielding film being between said conversion region opening and said micro lens.

19. An electronic apparatus comprising:
the solid-state imaging device according to claim 8;
an optical system configured to guide incident light to the imaging region photoelectric conversion unit;
a signal processing circuit configured to process a signal output from said solid-state imaging device.

* * * * *